United States Patent
Margarit et al.

(10) Patent No.: US 6,411,820 B1
(45) Date of Patent: Jun. 25, 2002

(54) SWITCHABLE PHASE LOCK LOOP FOR DUAL MODE APPLICATIONS

(75) Inventors: Mihai A. Margarit, Thousand Oaks; Jacques Ruiz, Encinitas, both of CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/295,036

(22) Filed: Apr. 20, 1999

(51) Int. Cl.[7] .............................. H04B 1/38; H04M 1/00
(52) U.S. Cl. ..................... 455/553; 455/86; 455/260; 455/264; 455/318; 332/127
(58) Field of Search ............................ 455/78, 80, 84, 455/86, 260, 264, 318, 553; 331/17; 332/127; 375/376

(56) References Cited

U.S. PATENT DOCUMENTS

| | | |
|---|---|---|
| 5,732,330 A | 3/1998 | Anderson et al. ............. 455/76 |
| 5,844,868 A | 12/1998 | Takahashi et al. ............. 369/6 |
| 5,983,081 A * | 11/1999 | Lehtinen ....................... 455/76 |
| 6,208,875 B1 * | 3/2001 | Damgaard ................... 455/552 |
| 6,215,362 B1 * | 4/2001 | Feng ............................. 331/17 |
| 6,249,188 B1 * | 6/2001 | Kaneko ........................ 331/17 |

* cited by examiner

Primary Examiner—Vivian Chin
Assistant Examiner—James K Moore
(74) Attorney, Agent, or Firm—Knobbe, Martens Olson and Bear LLP (57) ABSTRACT

A dual-mode wireless telephone which is capable of operating on two different bands of frequencies. The dual-mode telephone having a single phase lock loop combined with a single local oscillator that can select between two frequencies in two widely spread output frequency bands such as the bands in the GSM and DCS standards. A switch in the phase lock loop selectively swaps an UP signal and a DOWN signal to achieve either a high side lock or a low side lock. When the phase lock loop is high side locked, a target frequency in a higher band of output frequencies is generated. When the phase lock loop is low side locked, a target frequency in a lower band of output frequencies is generated.

32 Claims, 8 Drawing Sheets

SWITCHABLE PHASE LOCK LOOP FOR DUAL MODE APPLICATIONS

BACKGROUND

1. Field of the Invention

This invention relates to the field of wireless communication systems. More specifically, the invention relates to an RF transceiver circuit for a dual mode mobile unit.

2. Description of the Related Art

The use of wireless communication systems is growing with users now numbering well into the millions. In one type of wireless communication system, the cellular network, a mobile unit communicates with an associated base station at a predefined band of radio frequencies. The base station in turn communicates with a land based telephone system, effectively linking the mobile unit to the land based telephone system.

As a mobile unit travels through a cellular network, the mobile unit moves through service areas known as cells. Each cell is a specific geographic region containing a base station. When moving from one cell to another, the base station servicing the mobile unit changes from the base station of one cell to the base station of another cell.

The number of companies competing to offer wireless communications is growing. In an effort to offer differing products, and due to FCC regulations limiting the number of licenses at a specific band of frequencies, the cellular systems offered operate on a variety of different bands of frequencies. When leaving one cellular system and moving into another, the frequency at which the base stations operate may change. Because most original mobile units were designed to operate only within a set band of frequencies, the mobile units could not function with both cellular systems, each operating at different sets of frequency bands. For example, a mobile unit designed for use with a system using the Global System for Mobile communications (GSM) operating at a band of frequencies around 900 MHz would not function in a second cellular system using the Digital Cellular System (DCS) operating at a band of frequencies around 1800 MHz. In particular, each band of frequencies for both the GSM system and the DCS system is divided into channels, and any specific transmission is accomplished within a channel. Each channel has a width of 200 kilohertz (kHz).

Dual-mode mobile units were created to allow one mobile unit to be more flexible and have the ability to operate with multiple cellular systems. It should be kept in mind that one company may offer service in two separate bands, offering those customers with dual-mode mobile units more channels to choose from. These original dual-mode mobile units sometimes contained a separate oscillator and associated circuitry to generate each separate frequency. Although this allowed the mobile unit to cross-over to a second cellular system, the addition of the second oscillator and associated circuitry increased the size, cost, and complexity of the mobile unit. Because mobile units are designed to be portable, it is also always desirable to reduce the size of the mobile unit.

What is needed is a mobile unit capable of operating at two separate frequencies without the increasing the size and cost of the mobile unit from that of the single mode mobile unit.

SUMMARY

In one embodiment of the present invention a wireless telephone is provided which is capable of operation at two different bands of radio frequencies. The wireless telephone generates the two frequencies bands using only a single phase lock loop. Because only one phase lock loop is used to generate the two frequencies, the wireless telephone may be constructed with only a single local oscillator. Reducing the number of local oscillators decreases the physical size of the wireless telephone and reduces the cost of manufacture. Further, a lower frequency oscillator can be used. This also reduces cost because an accurate, high quality, low frequency oscillator is less expensive than a higher frequency oscillator with similar accuracy and quality.

One embodiment of the invention is a dual-mode telephone having a single phase lock loop that can select between two output frequency bands. A switch in the phase lock loop selectively swaps an UP signal and a DOWN signal to achieve either a high side lock or a low side lock. When the phase lock loop is high side locked, one of the frequencies in the higher band of output frequencies may be generated. When the phase lock loop is low side locked, one of the frequencies in the lower band of output frequencies may be generated.

Another embodiment of the invention is a dual-mode wireless telephone having a phase lock loop with two selectable bands of output frequencies. The dual-mode wireless telephone includes a mixer which receives a local oscillator signal and an output signal. The mixer then generates a delta signal. A phase comparator compares the delta signal with an intermediate signal and generates an UP signal and a DOWN signal based on the results of the comparison. A switch having a first output and a second output receives the UP signal and the DOWN signal. In a first position, the switch outputs the UP signal on the first output and the DOWN signal on the second output. In a second position, the switch outputs the UP signal on the second output and the DOWN signal on the first output. A signal generator then converts the UP signal and the DOWN signal into a control signal, which is used by a voltage controlled oscillator to adjust the frequency of the output signal.

Another embodiment of the invention is a method of having either a high side lock or a low side lock from a phase lock loop. The method includes the steps of combining a local oscillator signal with an output signal to create a combined signal, and then comparing the combined signal with an intermediate signal. Based on the comparison of the first combined signal and the intermediate signal, an UP signal is generated on a first signal line and a DOWN signal is generated on a second signal line. The method further includes the steps of selecting either a high side lock or a low side lock of the phase lock loop, and switching the UP signal to the second signal line and the DOWN signal to the first signal line if the low side lock is selected. A control signal is then generated based on the values of the signals on the first signal line and the second signal line and the frequency of the output signal is adjusted based on the control signal.

Another embodiment of the invention is a phase lock loop capable of selectively generating an output signal operating within one of two bands of frequencies. The phase lock loop includes a phase detector which generates a first signal and a second signal and a signal generator which generates a control signal based on the signals from the phase detector. The phase lock loop also includes an output frequency selector having a first position and a second position. In the first position, the output frequency selector transfers the first signal to a first input of the signal generator and transfers the second signal to a second input of the signal generator. In a second position, the output frequency selector transfer the first signal to the second input of the signal generator and transfers the second signal to the first input of the signal generator. An oscillator receives the control signal and adjusts the frequency of the output signal based on the control signal.

Another embodiment of the invention is a dual-mode wireless telephone having a single phase lock loop with a selectable output frequency band. The dual-mode wireless telephone includes means for selecting the desired output frequency band and means for locking the phase lock loop on either a high side or a low side. The choice of the high side lock or the low side lock is determined by the selecting means. The dual-mode telephone also includes means for generating a first output signal within a first band of frequencies when the phase lock loop is high side locked, and means for generating a second output signal within a second band of frequencies when the phase lock loop is low side locked.

BRIEF DESCRIPTION OF THE DRAWINGS

These and other features and advantages of the invention will become more apparent upon reading the following detailed description and upon reference to the accompanying drawings.

DETAILED DESCRIPTION

Figure 1:
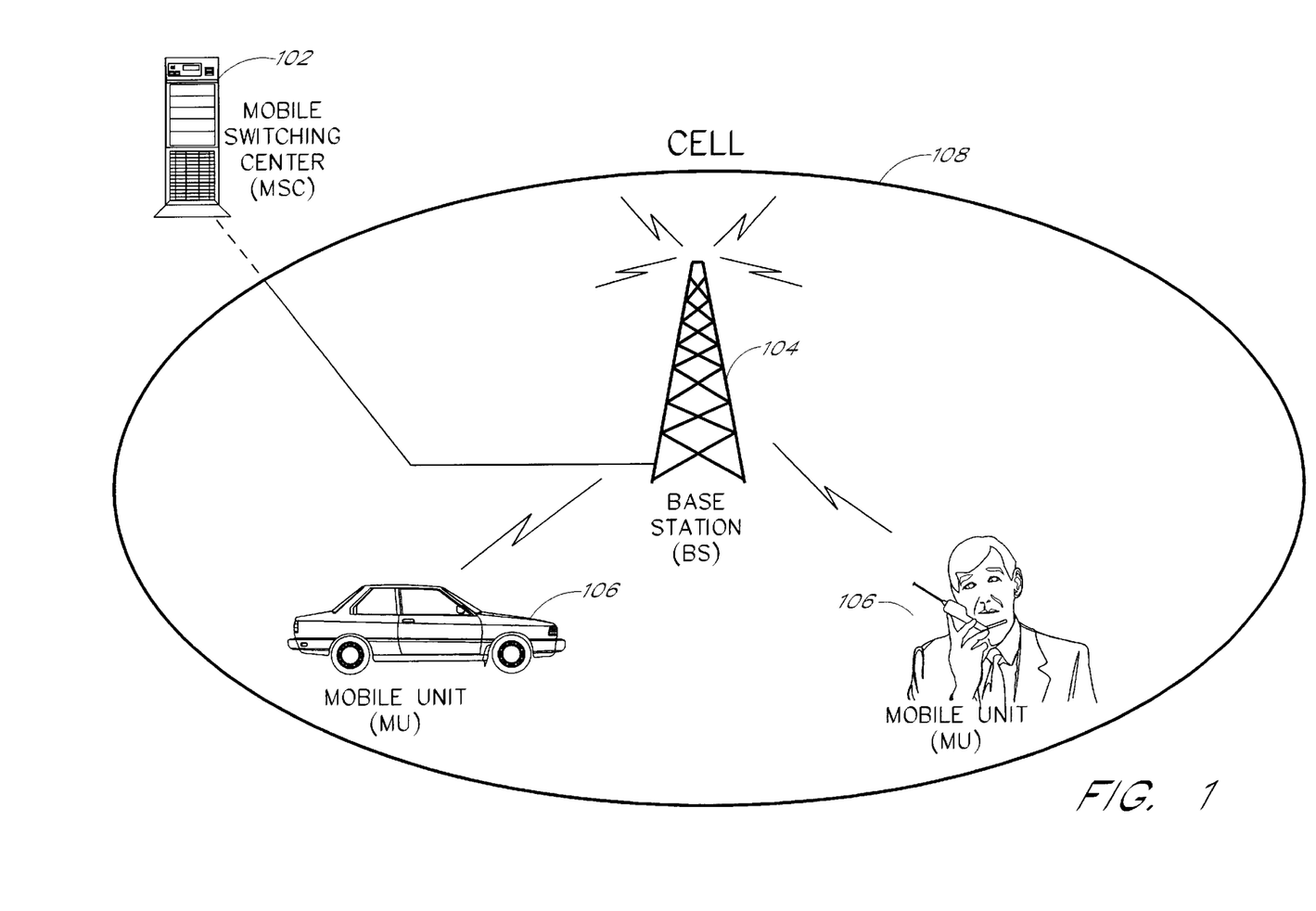
FIG. 1 illustrates components of a wireless communication system appropriate for use with an embodiment of the invention.

FIG. 1 illustrates components of a wireless communication system. A mobile switching center 102 communicates with a base station 104. The base station 104 broadcasts data to and receives data from mobile units 106 within a cell 108. The cell 108 is a geographic region, roughly hexagonal, having a radius of up to 35 kilometers or possibly more.

The mobile unit 106 may be capable of receiving data from and transmitting data to a base station 104 in compliance with a variety of communication standards, including analog standards and digital standards like the Global System for Mobile communications (GSM) and the Digital Cellular System (DCS). The communication standards permit mobile users of wireless communication devices to exchange data over a telephone system wherein radio signals carry data to and from the wireless devices. For example, under the GSM standard, additional cells adjacent to the cell 108 permit mobile units 106 to cross cell boundaries without interrupting communications. This is because base stations 104 in adjacent cells assume the task of transmitting and receiving data for the mobile units 106. The mobile switching center 102 coordinates all communication to and from mobile units 106 in a multi-cell region, thus the mobile switching center 102 may communicate with many base stations 104.

The mobile units 106 may move about freely within the cell 108 while communicating either voice or data. The mobile units 106 not in active communication with other telephone system users may, nevertheless, scan base station 104 transmissions in the cell 108 to detect any telephone calls or paging messages directed to the mobile unit 106.

One example of such a mobile unit 106 is a cellular telephone used by a pedestrian who, expecting a telephone call, powers on the cellular telephone while walking in the cell 108. The cellular telephone synchronizes communication with the base station 104. The cellular telephone then registers with the mobile switching center 102 to make itself known as an active user within the network.

The mobile unit 106 scans data frames broadcast by the base station 104 to detect any telephone calls or paging messages directed to the cellular telephone. In this call detection mode, the mobile unit 106 receives, stores and examines paging message data, and determines whether the data contains an identifier matching an identifier of the mobile unit 106. If a match is detected, the mobile unit 106 establishes a call with the mobile switching center 102 via the base station 104. If no match is detected, the mobile unit 106 enters an idle state for a predetermined period of time, then exits the idle state to receive another transmission of paging message data.

A common implementation of the GSM system uses frequencies in the 900 megahertz (MHz) range. In particular, in the GSM system mobile units 106 transmit in the 890–915 MHz range and base stations 104 transmit in the higher 935–960 MHz range. Each 25 MHz range is divided into 125 radio frequency channels, each having a width of 200 kilohertz (kHz). The direction of communication from a mobile unit 106 to a base station 104 is referred to as uplink, and the direction from a base station 104 to a mobile unit 106 is referred to as downlink. In contrast, DCS systems use frequencies in the 1,800 MHz (1.8 Gigahertz) range. In particular, in the DCS system mobile units 106 uplink in the 1,710–1,785 MHz range and base stations 104 downlink in the higher 1,805–1,880 MHz range, with each 75 MHz range divided into 374 radio frequency channels, each having a width of 200 kilohertz (kHz).

Figure 2:
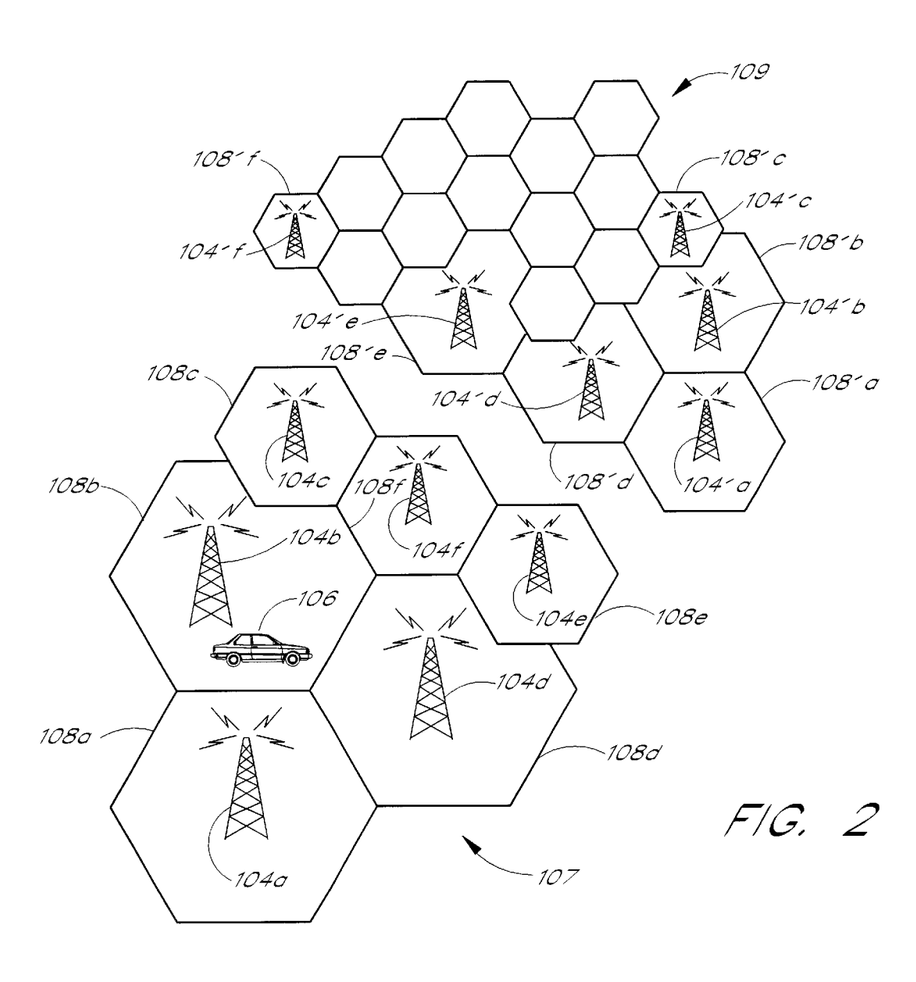
FIG. 2 illustrates two separate wireless communication systems, each system containing a series of cells.

FIG. 2 illustrates one example of a series of cells 108a–108f in a first wireless communication system 107 such as a GSM system and a second series of cells 108'a–108'f in a second wireless communication system 109 such as a DCS system. The cells 108'a–108'f and 108'a–108 f are generally hexagonal, although they may be other shapes including circular, square, oval, oblong, or any other polygon. The size of each cell 108a–108n and 108'a–108'd may vary depending on location. For example, in densely packed urban areas, a cell 108'c may be small but in a more rural area the size of a cell 108a is larger. Each of the cells 108a–108f has a corresponding base station 104a–104f and each of the cells 108'a–108'f has a corresponding base station 104'a'104'f.

In FIG. 2, the mobile unit 106 is located in the cell 108b in the first communication system 107. While the mobile unit 106 is in cell 108b, it is likely being served by the base station 104b, although due to loading and other requirements, it may be served by any base station 104 providing a useable signal. The mobile unit 106 may eventually travel into the second communication system 109, beyond the coverage of the first communication system 107. In this circumstance, if the mobile unit 106 continues to operate on the frequency of the first communication system 107, reception will be lost. Therefore, the mobile unit detects the frequency of operation of the second communication system 109 and switches to the new operating frequency. Of course, the mobile unit 106 must be capable of operating at the two separate frequencies or communications may be lost.

Although the example of FIG. 2 shows the two communication systems 107 and 109 occupying different geographical regions, it can be appreciated that the communication systems 107 and 109 may both cover the same region. In this situation, the mobile unit 106 may choose with which of the two communication systems 107 and 109 to operate. In this circumstance, if a signal from one of the two communication systems 107 or 109 begins to fade, or if all the channels are utilized, the mobile unit 106 may seamlessly switch to the second communication system without disconnecting from the cellular network.

Alternatively, a single communication system may be designed to operate with multiple communication standards. In this embodiment, each base station 104 may transmit and receive at two separate bands of frequencies. Because each base station 104 can operate on two frequency bands, the total number of channels available to each base station 104, and therefore the number of mobile units 106 each base station may communicate with, is increased.

Figure 3:
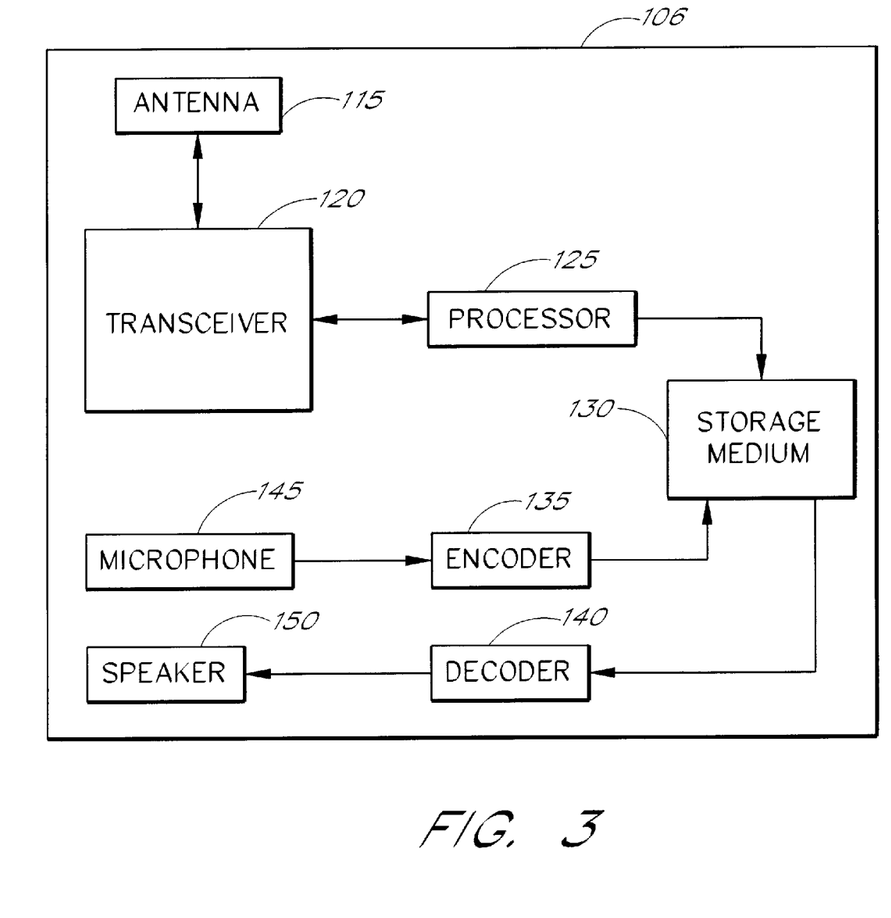
FIG. 3 illustrates a block diagram of a mobile unit according to one embodiment of the invention.

FIG. 3 illustrates one embodiment of the mobile unit 106. The mobile unit 106 downlinks the signals from the base station 104 at a transceiver 120 via an antenna 115. The transceiver 120 may also uplink information to the base station 104. Alternatively, a separate receiver and transmitter may be used in place of the transceiver 120. After receiving the signals, the transceiver 120 relays the signals to a processor 125. In one embodiment, a microprocessor performs the function of the processor 125. Of course, other types of processors may be used including conventional general purpose single- or multi-chip microprocessors, digital signal processors, embedded microprocessors, microcontrollers and the like.

The processor 125 converts the signals into data and performs the functions requested by the signal. This may include an indication that a call is pending. The mobile unit 106 may inform the user of a pending call by a variety of methods, including ringing, vibrating or flashing lights. During the pendency of a call, the data transmitted and received by the mobile unit 106 may include voice and data.

The data created by the processor 125 may be temporarily or permanently stored in a storage medium 130. The storage medium 130 may comprise any method of storing information. For example, the storage medium 130 may comprise an electrically erasable programmable read-only memory (EEPROM), read-only memory (ROM), random access memory (RAM), hard disks, floppy disks, laser disc players, digital video devices, compact discs, video tapes, audio tapes, magnetic recording tracks, and other techniques to store data.

The data from the storage medium 130 may be transmitted through a decoder 140 to a speaker 150. The decoder 140 may comprise a digital-to-analog converter or the like. The decoded data may then be played through the speaker 150 to be heard by the user.

The user may also direct voice into the microphone 145 of the mobile unit 106. The voice data passes through an encoder 135 and may be stored for a short time by the storage medium 130 prior to processing by the processor 125. The encoder 135 may comprise an analog-to-digital converter or the like. The processor 125 maintains two-way communication with the transceiver 125, and therefore the voice data may be sent from the mobile unit 106 to the base station 104.

Figure 4A:
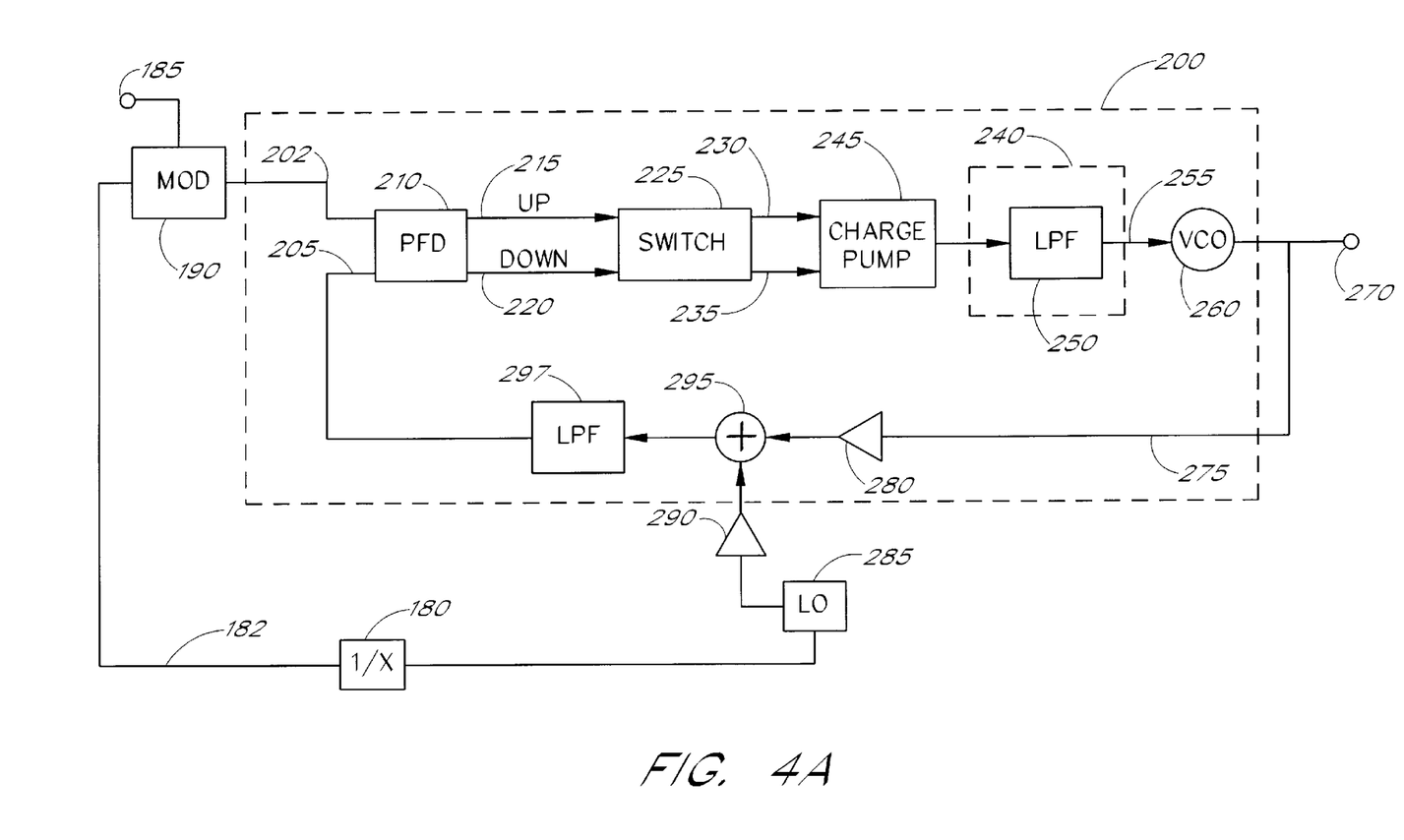
FIG. 4A illustrates a block diagram of a phase lock loop according to one embodiment of the invention.

FIG. 4A illustrates one embodiment of a phase lock loop 200 as used within the transceiver according to the present invention. The phase lock loop 200 has a phase frequency detector (PFD) 210 having a first input 202 and a second input 205. The phase frequency detector 210 compares the frequency of the signal on the first input 202 and the signal on the second input 205. The first input 202 inputs a modulated intermediate frequency signal into the phase frequency detector 210. The frequency of the modulated intermediate frequency signal is preselected in the initial programming of the mobile unit 106. The second input 205 inputs a delta signal obtained by comparing an output signal 270 with a signal from a local oscillator 285. If the signal on the second input 205 lags the signal on the first input 202 in frequency, the phase frequency detector 210 outputs an UP signal 215 with a high value and a DOWN signal 220 with a low value. If the signal on the second input 205 leads the signal on the first input 202 in frequency, the phase frequency detector 210 outputs an UP signal 215 with a low value and a DOWN signal 220 with a high value.

Figure 4B:
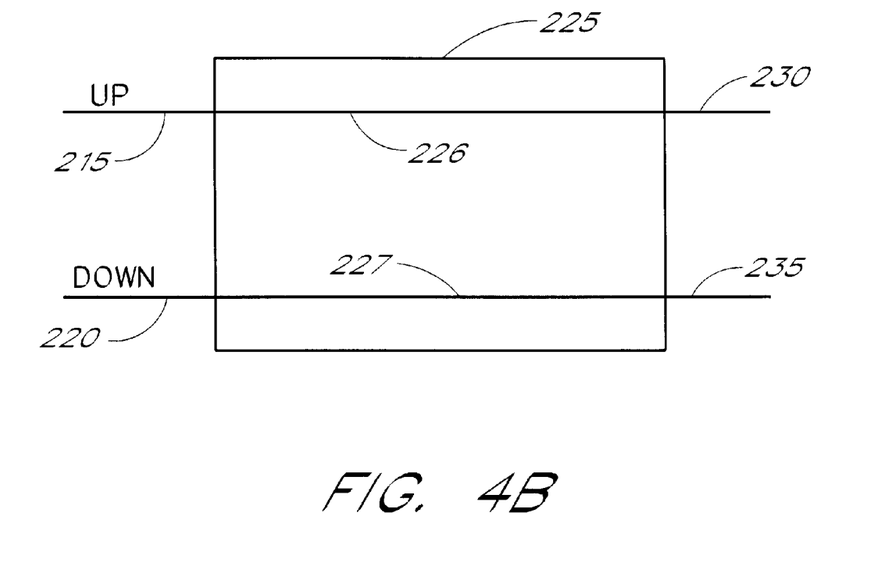
FIG. 4B illustrates a block diagram of a first position of the switch in the phase lock loop of FIG. 4A according to one embodiment of the invention.
Figure 4C:
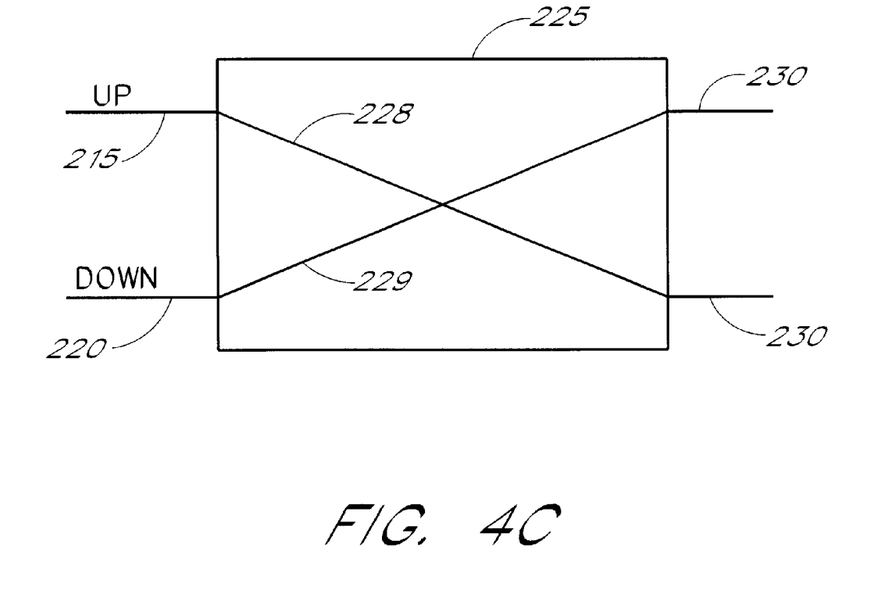
FIG. 4C illustrates a block diagram of a second position of the switch in the phase lock loop of FIG. 4A according to one embodiment of the invention.

The UP signal 215 and the DOWN signal 220 are received by a switch 225. The switch 225 has a first output 230 and a second output 235 and achieves the functions of a standard double-pole, double-throw switch. The switch 225 is used to control whether the phase lock loop 200 locks on a high side or a low side. The two positions of the switch 225 are shown in FIGS. 4B and 4C respectively. If a high side lock is desired, the switch 225 transfers the UP signal 215 along a path directly to the first output 230 (path 226 as shown in FIG. 4B) and transfers the DOWN signal 220 directly to the second output 235 along a path 227 as illustrated in FIG. 4B. However, if a low side lock is desired, the switch 225 transfers the UP signal 215 directly to the second output 235 along a path 228 as shown in FIG. 4C and transfers a DOWN signal 220 directly to the first output 230 along a path 229 as illustrated in FIG. 4C. By inserting the switch 225, the phase lock loop 200 of the present invention can selectively lock on either the high side or the low side, thereby creating the ability for one phase lock loop to be used to alternatively generate frequencies in two output frequency bands using only a single local oscillator.

The first output signal 230 and the second output signal 235 are received by a charge pump 245 and a signal generator 240. In one embodiment of the invention, the signal generator 240 comprises a low pass filter (LPF) 250. The signal generator 240 creates a control signal 255 based on the values of the first output signal 230 and the second output signal 235. The control signal 255 controls a voltage controlled oscillator (VCO) 260 to generate the output signal 270.

If the value of the first output signal 230 is high and the value of the second output signal 235 is low, the control signal 255 generated by the signal generator 240 causes the voltage controlled oscillator 260 to increase the frequency of the output signal 270. However, if the value of the second output signal 235 is high while the value of the first output signal 230 is low, the control signal 255 generated by the signal generator 240 causes the voltage control oscillator 260 to decrease the frequency of the output signal 270. If the value of both the first output signal 230 and the second output signal 235 are low, the control signal 255 generated by the signal generator 240 causes the voltage controlled oscillator 260 to generate an output signal 270 without a change in frequency. Although the present invention can generate two output frequency bands at any two frequency bands, it is preferable if the frequency bands are separated by at least 200 MHz, more preferably separated by 500 MHz, and most preferably separated by 900 MHz.

The output signal 270 is modulated with the voice or data signal 185. The output signal 270 is transferred from the phase lock loop 200 to an amplifier and then to antenna 115 for transmission.

The output signal 270 is also fed back to a buffer 280 on a feedback path 275. The local oscillator signal 285 is also input into a buffer 290. A mixer 295 receives the outputs of the buffers 280 and 290. The mixer 295 combines the output signal 270 with the local oscillator signal 285 to create both a delta signal and a combination signal. The delta signal has a frequency equal to the difference in the frequency of the output signal 270 and the local oscillator signal 285, and the combination signal has a frequency equal to the sum of the frequencies of the output frequency 270 and the local oscillator frequency 285. Both the delta signal and the combination signal are then input into a low pass filter 297. The low pass filter 297 is designed to filter out the combination signal and pass only the delta signal to the second input 205.

Figure 6:
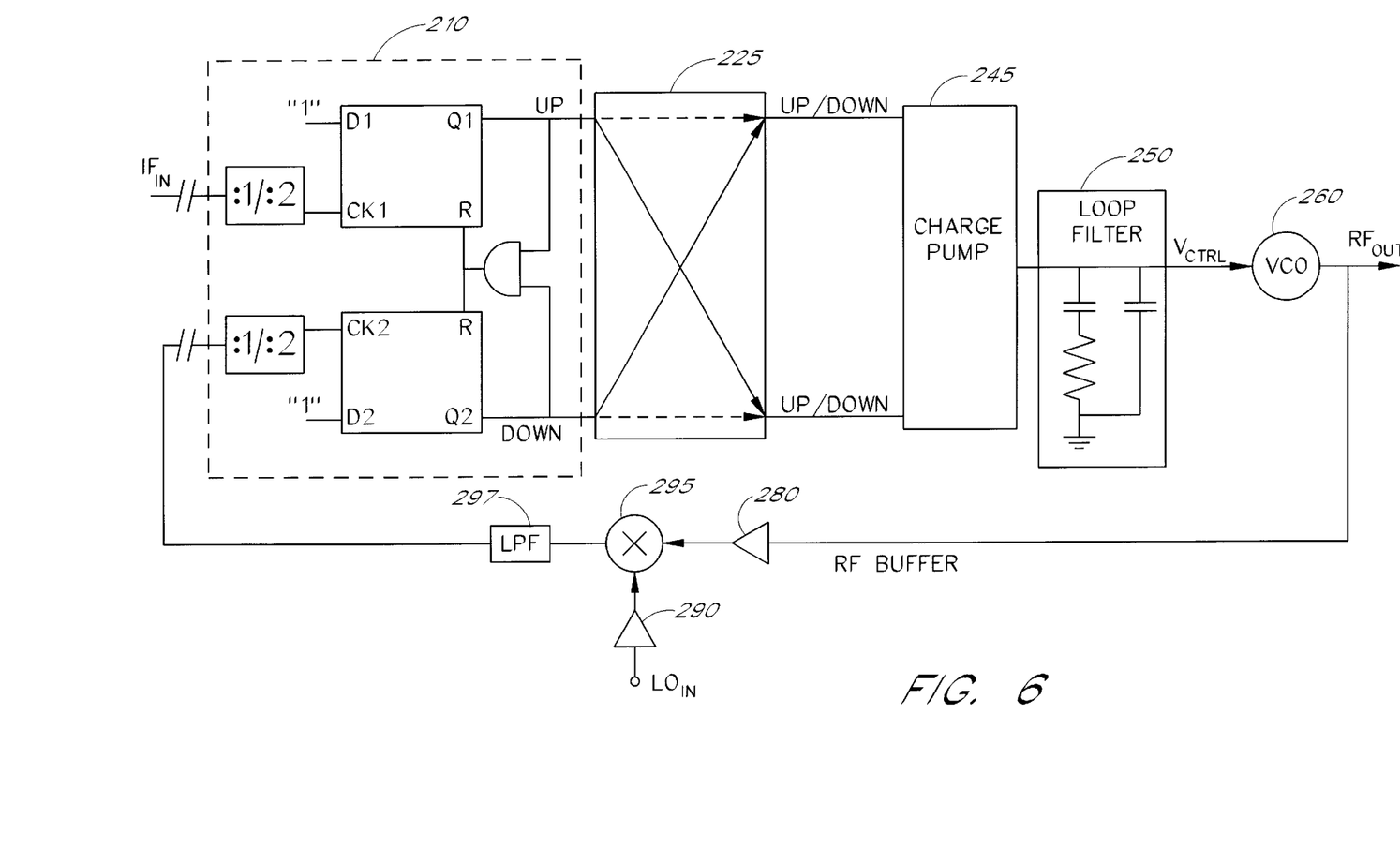
FIG. 6 illustrates a block diagram of a phase lock loop of FIG. 4A according to an alternative embodiment of the invention.

The local oscillator 285 generates a signal at a preselected range of frequencies. The signal generated by the local oscillator 285 is used as an input to the mixer 295 and as an input to a divider 180. The divider 180 creates an intermediate frequency signal 182. The intermediate frequency signal 182 is input into a modulator 190, along with a voice or data signal 185. The modulator 190 modulates the voice or data signal 185 onto the intermediate frequency signal 182 to create a modulated intermediate frequency signal. The modulated intermediate frequency signal is then input to the phase lock loop 200 on the first input 202. One specific embodiment of the phase lock loop 200 according to the present invention is illustrated in FIG. 6.

Figure 5:
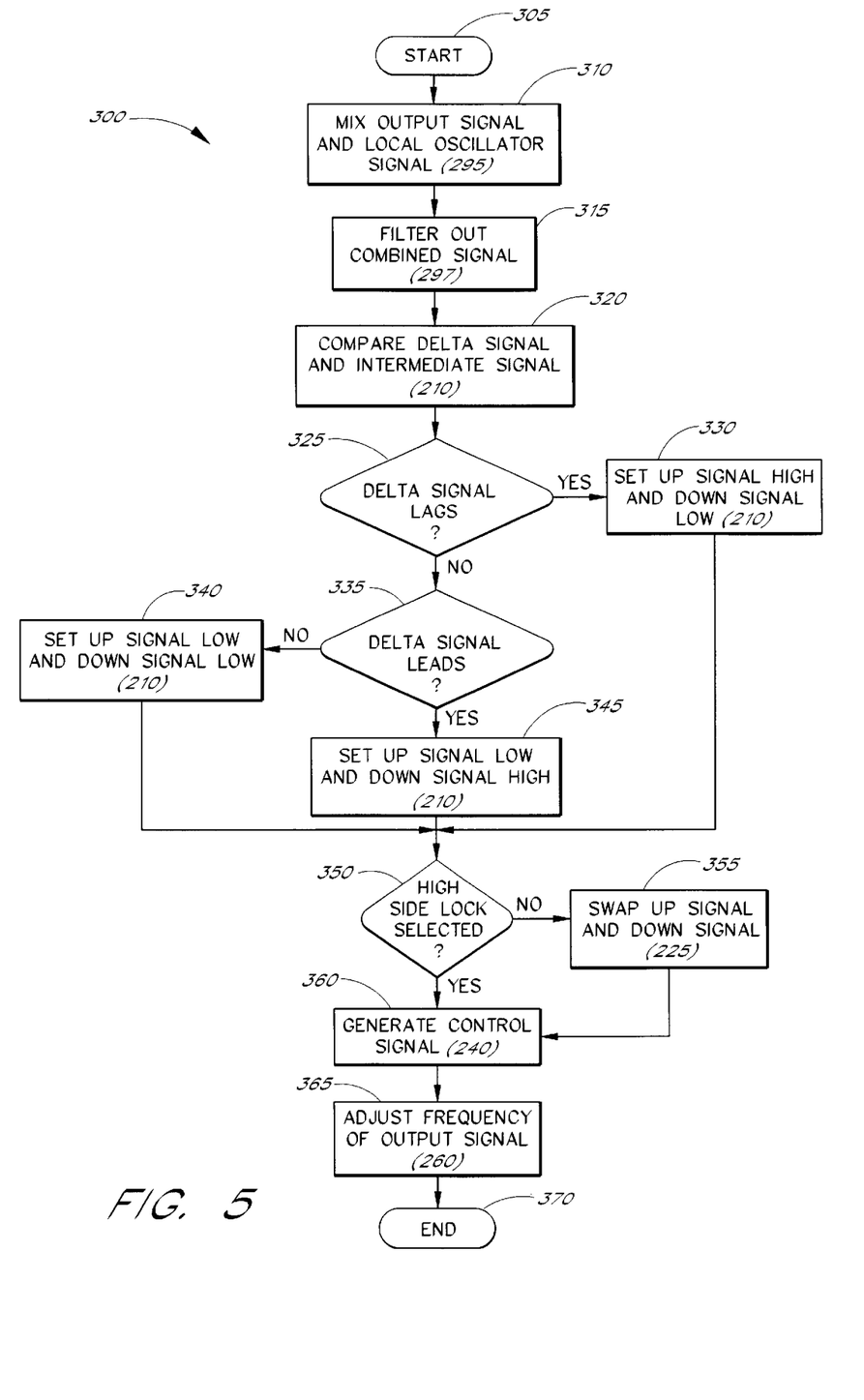
FIG. 5 illustrates the steps performed by the phase lock loop of FIG. 4 to generate two separate frequencies.

The actual operation of a cycle of the phase lock loop 200 according to the present invention is illustrated using the flowchart 300 in FIG. 5. Although the phase lock loop 200 is described herein in connection with the operation of the transmission portion of the transceiver, it can be appreciated the present invention may also be used with the receiver portion. The phase lock loop 200 initializes at a start state 305. Proceeding to state 310, the phase lock loop 200 mixes the output signal 270 and the local oscillator signal 285. This is accomplished with mixer 295. As stated above, the mixer generates the delta signal which has a frequency equalling the difference of the output signal 270 and the local oscillator signal 285 and the combination signal having a frequency equalling the combined frequencies of the output signal 270 and the local oscillator signal 285.

Proceeding to state 315, the phase lock loop 200 filters out the combination signal having the higher frequency using the low pass filter 297. This places only the delta signal on the input 205.

Proceeding to state 320, the phase lock loop 200 compares the delta signal with the modulated intermediate signal. This comparison is performed by the phase frequency detector 210. Proceeding to state 325, the phase frequency detector 210 determines if the delta signal frequency lags the modulated intermediate signal frequency. If the delta signal frequency does lag the modulated intermediate signal, the phase frequency detector proceeds along the YES branch of state 325 to state 330. In state 330, the phase frequency detector 210 sets the UP signal to a high value and the DOWN signal to a low value.

Returning to state 325, if the phase frequency detector 210 does not determine that the delta signal frequency lags the modulated intermediate signal frequency the phase frequency detector 210 proceeds along the NO branch of state 325 to state 335. In state 335, the phase frequency detector 210 determines if the delta signal frequency leads the modulated intermediate signal frequency. If the delta signal frequency does lead the modulated intermediate signal frequency, the phase frequency detector 210 proceeds along the YES branch to state 345. In state 345, the phase frequency detector sets the UP signal to a low value and the DOWN signal to a high value.

Returning to state 335, if the phase frequency detector 210 determines that the low frequency signal does not lead the modulated intermediate frequency signal, then the signals must have the same frequency. In this situation, the phase frequency detector 210 proceeds along the NO branch of state 355 to state 340. In state 340, the phase frequency detector 210 sets both the UP signal and the DOWN signal to a low value.

After the phase frequency detector 210 sets the values of the UP signal 215 and the DOWN signal 220 in either states 330, 335 or 340, the phase lock loop 200 proceeds to state 350. In state 350, the phase lock loop 200 determines if the phase lock loop 200 is selected to lock on the high side. If the phase lock loop 200 is not selected to lock on the high side, the phase lock loop 200 proceeds along the NO branch to state 355. In state 355, the UP signal is swapped with the DOWN signal. This swap is performed by the embodiment of the switch 225 illustrated in FIG. 4C. Swapping the signals in state 355 causes the UP signal 215 to be output on the second output 235 and the DOWN signal 220 to be output on the first output 230.

Returning to state 350, if the high side lock is selected, the phase lock loop 200 proceeds along the YES branch of state 350. In state 350, the switch 225 as illustrated in FIG. 4B passes the UP signal 215 and the DOWN signal 220 directly across to the outputs 230 and 235.

After placing the UP signal and the DOWN signal on the proper outputs 230 and 235, the phase lock loop 200 proceeds to state 360. In state 360, the phase lock loop 200 generates a control signal 255 using the signal generator 240. The phase lock loop 200 then proceeds to state 365 and adjusts the frequency of the output signal according to the value of the control signal 255. The adjustment of the output signal is accomplished using the voltage controlled oscillator 260. As stated above, if the value of the signal on the first output 230 is high and the value and the signal on the output 235 is low, the signal generator 240 generates a control signal 255 causing the voltage controlled oscillator 260 to increase the frequency of the output signal 270. However, if the value of the signal on the output 230 is low and the value of the signal on the output 235 is high, the signal generator 240 generates an output signal 255 causing the voltage controlled oscillator 260 to decrease the frequency of the output signal 270. If both the signals on the outputs 230 and 235 are low, the control signal 255 generated causes the voltage controlled oscillator 260 to not change the frequency of the output signal. The cycle of the phase lock loop 200 then ends at END state 370.

In one specific embodiment, a mobile unit 106 advantageously has a dual mode phase lock loop 200 designed to operate in both the GSM standard and the DCS standard. In the GSM standard, the phase lock loop 200 generates an output signal 270 having a frequency band centered around 900 MHz. In the DCS standard, the phase lock loop 200 generates an output signal 270 having a frequency band centered around 1800 MHz. As an example, the target frequency in the GSM standard will be 900 MHz and the target frequency in the DCS standard will be 1800 MHz. A local oscillator frequency is chosen to be between the two operating frequency bands, or 1350 MHz. The intermediate frequency in this example is selected to be 450 MHz, and is generated from the local oscillator signal using a divider 180 having a 3:1 ratio.

To operate in the GSM standard, the mobile unit 106 indicates to the phase lock loop 200 to achieve a low side lock, thereby having the output signal operate at 900 MHz. When the output signal is above the desired frequency, for example at 950 MHz, the phase lock loop 200 drives the frequency down. The output signal at 950 MHz is mixed with the local oscillator frequency at 1350 MHz. A delta signal of 400 MHz and a combined signal of 2300 MHz are created by the mixer 295. The combined signal is removed by the low pass filter 297, and the delta signal of 400 MHz is input into the phase frequency detector 210 along with the modulated intermediate frequency of 450 MHz. Because the frequency of the delta signal is lower, or lags the frequency of the modulated intermediate signal, the UP signal is set high and the DOWN signal is set low. Because a low side lock is selected (GSM standard), the UP signal is passed through to the second output 235 and the DOWN signal is passed through to the first output 230, thereby placing a high signal on the second output 235 and a low signal on the first output 230. Because a high signal is on the second output 235, the signal generator 240 creates a control signal that causes the voltage controlled oscillator 260 to decrease the frequency of the output signal 270, or drive the original 950 MHz frequency back towards the desired 900 MHz.

In a similar manner, when the output signal is below the desired frequency, for example at 850 MHz, the phase lock loop 200 on a low side lock drives the frequency up. The output signal at 850 MHz is mixed with the local oscillator frequency at 1350 MHz. A delta signal of 500 MHz and a combined signal of 2200 MHz are created by the mixer 295. The combined signal is removed by the low pass filter 297, and the delta signal of 500 MHz is input into the phase frequency detector 210 along with the modulated intermediate frequency of 450 MHz. Because the frequency of the delta signal is higher, or leads the frequency of the modulated intermediate signal, the UP signal is set low and the DOWN signal is set high. Because a low side lock is selected, the UP signal is passed through to the second output 235 and the DOWN signal is passed through to the first output 230, thereby placing a high signal on the first output 230 and a low signal on the second output 235. Because a high signal is on the first output 230, the signal generator 240 creates a control signal that causes the voltage controlled oscillator 260 to increase the frequency of the output signal 270, or drive the original 850 MHz frequency back towards the desired 900 MHz.

To operate in the DCS standard, the mobile unit 106 indicates to the phase lock loop 200 to switch and achieve a high side lock, thereby having the output signal operate for our example at 1800 MHz. When the output signal is above the desired frequency, for example at 1850 MHz, the phase lock loop 200 drives the frequency down. The output signal at 1850 MHz is mixed with the local oscillator frequency at 1350 MHz. A delta signal of 500 MHz and a combined signal of 3200 MHz are created by the mixer 295. The combined signal is removed by the low pass filter 297, and the delta signal of 500 MHz is input into the phase frequency detector 210 along with the modulated intermediate frequency of 450 MHz. Because the frequency of the delta signal is higher, or leads the frequency of the modulated intermediate signal, the UP signal is set low and the DOWN signal is set high. Because a high side lock is selected, the UP signal is passed through to the first output 230 and the DOWN signal is passed through to the second output 235, thereby placing a high signal on the second output 235 and a low signal on the first output 230. Because a high signal is on the second output 235, the signal generator 240 creates a control signal that causes the voltage controlled oscillator 260 to decrease the frequency of the output signal 270, or drive the original 1850 MHz frequency back towards the desired 1800 MHz.

In a similar manner, when the output signal is below the desired frequency, for example at 1750 MHz, the phase lock loop 200 on a high side lock drives the frequency up. The output signal at 1750 MHz is mixed with the local oscillator frequency at 1350 MHz. A delta signal of 400 MHz and a combined signal of 3100 MHz are created by the mixer 295. The combined signal is removed by the low pass filter 297, and the delta signal of 400 MHz is input into the phase frequency detector 210 along with the modulated intermediate frequency of 450 MHz. Because the frequency of the delta signal is lower, or lags the frequency of the modulated intermediate signal, the UP signal is set high and the DOWN signal is set low. Because a high side lock is selected, the UP signal is passed through to the first output 230 and the DOWN signal is passed through to the second output 235, thereby placing a high signal on the first output 230 and a low signal on the second output 235. Because a high signal is on the first output 230, the signal generator 240 creates a control signal that causes the voltage controlled oscillator 260 to increase the frequency of the output signal 270, or drive the original 1750 MHz frequency back towards the desired 1800 MHz.

Figure 7:
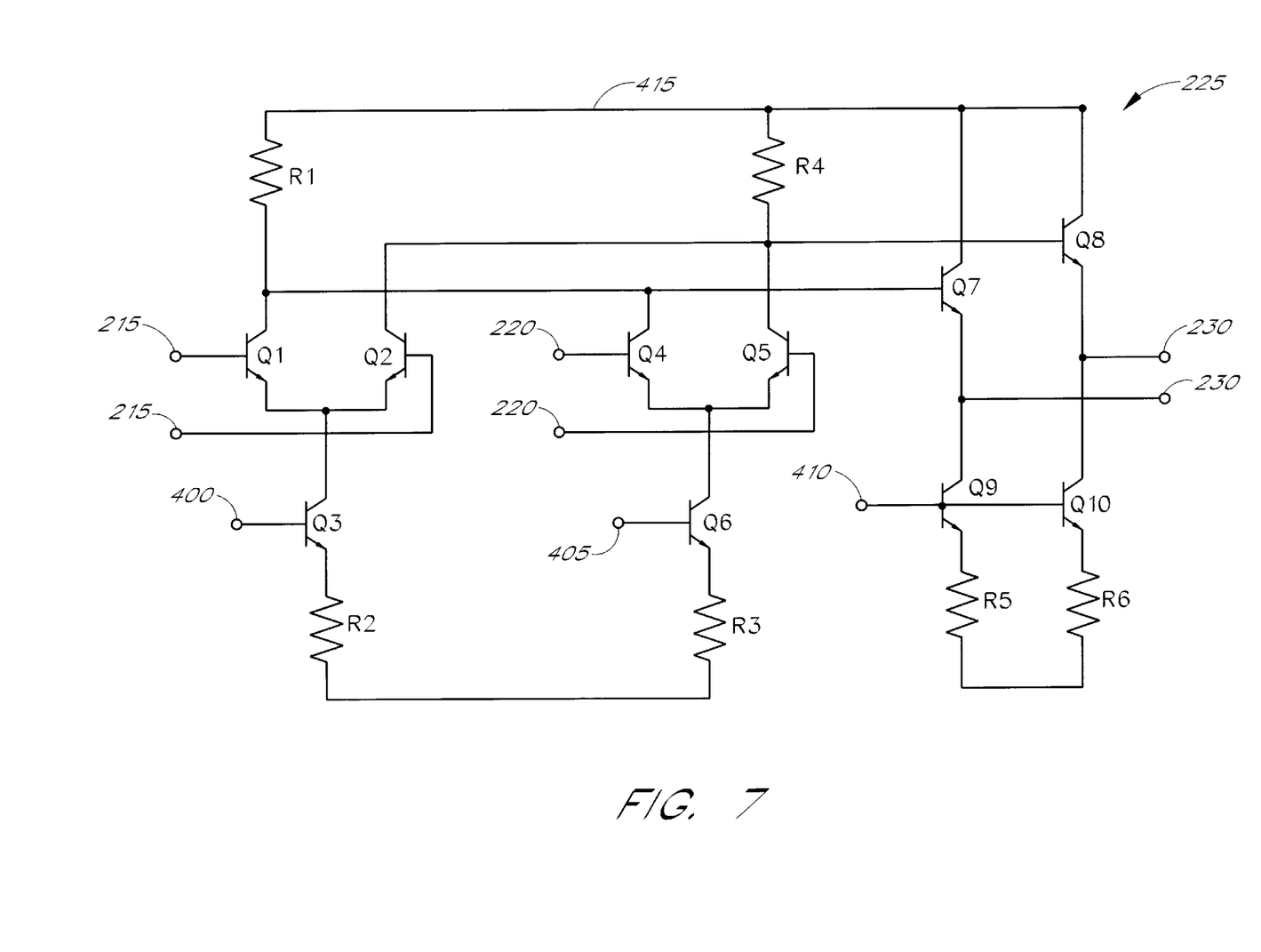
FIG. 7 illustrates one embodiment of the switch used in the phase lock loop of FIGS. 4A–4C.

One embodiment of the switch 225 of the phase lock loop 200 according to the present invention is illustrated in FIG. 7. The switch 225 is comprised of resistors R1, R2, R3, R4, R5 and R6 and transistors Q1, Q2, Q3, Q4, Q5, Q6, Q7, Q8, Q9 and Q10. The switch 225 illustrated in FIG. 6 comprises one-half of the full switch 225. The half of the switch 225 illustrated in FIG. 6 determines what signal is placed on the first output 230. A second half of the switch 225 is a duplicate of the circuit illustrated in FIG. 6 and controls the signal placed on the second output 235.

Each half of the switch 225 contains the UP signal 215 connected to the bases of the transistors Q1 and Q2. The emitters of the transistors Q1 and Q2 are connected together and are connected to a collector of the transistor Q3. The base of the transistor Q3 is connected to a first enable input 400. The emitter of transistor Q3 is connected to a first terminal of the resistor R2. The second terminal of the resistor R2 is connected to a second terminal of the resistor R3. The first terminal of the resistor R3 is connected to the emitter of the transistor Q6. The base of the transistor Q6 is connected to a second enable input 405.

The collector of the transistor Q6 is connected to the emitter of the transistor Q4 and to the emitter of the transistor Q5. The DOWN signal 220 is connected to the base of the transistor Q4 and to the base of the transistor Q5. The collector of the transistor Q4 is connected to the collector of the transistor Q1, to the base of the transistor Q7, and to a first terminal of the resistor R1. The collector of the transistor Q5 is connected to the collector of the transistor Q2, to the base of the transistor Q8, and to a first terminal of the resistor R4. The second terminal of the resistor R1 is connected to the second terminal of the resistor R4, to the collector of the transistor Q7, and to the collector of the transistor Q8, all of which are connected to a control voltage rail 415. The emitter of the transistor Q7 is connected to one terminal of the first output 230 and to a collector of the transistor Q9. The emitter of the transistor Q8 is connected to a second terminal of the first output 230 and to the collector of the transistor Q10. The base of the transistor Q9 and the base of the transistor Q10 are connected together and are connected to an enable voltage 210. The emitter of the transistor Q9 is connected to a first terminal of the resistor R5 and the emitter of the transistor Q10 is connected to a first terminal of the resistor R6. The second terminal of the resistor R5 is connected to the second terminal of the resistor R6. It can be appreciated that each of the elements of the switch 225 can be embodied on an integrated circuit.

The half of the switch 225 illustrated in FIG. 6 allows either the UP signal 215 or the DOWN signal 220 to be transferred to the first output 230. If a high side lock of the phase lock loop 200 is desired, the first enable input 400 is enabled while the second enable input 405 is disabled. By enabling the first enable input 400, the transistor Q3 is switched on which allows the UP signal 215 to be transferred through the transistors Q1 and Q2 to the bases of the transistors Q7 and Q8. By activating the enable signal 410, the transistors Q9 and Q10 are switched on to allow the UP signal to be transferred through the transistors Q7 and Q8 to the first output 230. Because the second enable input 405 is not activated, the DOWN signal 220 does not get transferred through the transistors Q4 and Q5. For a high side lock, the second half of the switch would enable the second enable input 405 and disable the first enable input 400, allowing the DOWN signal to be transferred to the second output 235.

If a low side lock of the phase lock loop 200 is desired, the second enable input 405 is enabled and the first enable input 400 is disabled. By enabling the second enable input 405, the transistor Q6 switches on causing the DOWN signal to be passed through the transistors Q4 and Q5 to the bases of the transistors Q7 and Q8. The enable signal 410 turns on the transistors Q9 and Q10, thereby passing the DOWN signal through transistors Q7 and Q8 to the first output 230. Of course, the second half of the switch would also pass the UP signal 215 to the second output 235. Although one embodiment of the switch 225 is illustrated in FIG. 6, it can be appreciated that any technique to transfer the UP signal to the first output 230 when a high side lock is desired and the UP signal to the second output 235 when a low side lock is desired can be achieved.

In one embodiment, the resistors R1 and R4 have a value of 2 KΩ. The resistors R2 and R3 have a value of 1 KΩ, and the resistors R5 and R6 have a value of 3 KΩ. The transistors Q1, Q2, Q4, and Q5 are nh032 transistors. The transistors Q3 and Q6 are nh0432c2 transistors. The transistors Q7 and Q8 are n02 transistors, and the transistors Q9 and Q10 are nh02 transistors.

Numerous variations and modifications of the invention will become readily apparent to those skilled in the art. Accordingly, the invention may be embodied in other specific forms without departing from its spirit or essential characteristics. The detailed embodiment is to be considered in all respects only as illustrative and not restrictive and the scope of the invention is, therefore, indicated by the appended claims rather than by the foregoing description. All changes which come within the meaning and range of equivalency of the claims are to be embraced within their scope.

What is claimed is:

1. A dual-mode wireless telephone having a phase lock loop (PLL) with two selectable bands of operating frequencies, the dual-mode wireless telephone comprising:
   a mixer which receives a local oscillator signal and an output signal, the mixer generating a delta signal of a first frequency;
   a phase comparator which compares the delta signal of the first frequency with an intermediate signal of a second frequency, the phase comparator generating an UP signal and a DOWN signal based on the results of the comparison;
   a switch having a first output and a second output which receives the UP signal and the DOWN signal, wherein the switch outputs the UP signal on the first output and the DOWN signal on the second output when the switch is in a first position in which the PLL causes the dual-mode wireless telephone to operate in a first mode, and the switch outputs the UP signal on the second output and the DOWN signal on the first output when the switch is in a second position in which the PLL causes the dual-mode wireless telephone to operate in a second mode;
   a signal generator which converts the UP signal and the DOWN signal into a control signal; and
   a voltage controlled oscillator which receives the control signal and adjusts the output signal based on the control signal.

2. The dual-mode wireless telephone of claim 1, wherein the phase lock loop creates a high side lock when the switch is in the first position.

3. The dual-mode wireless telephone of claim 1, wherein the phase lock loop creates a low side lock when the switch is in the second position.

4. The dual-mode wireless telephone of claim 1, wherein the mixer generates both a combination frequency and the delta frequency, the combination frequency being eliminated by a low-pass filter prior to reaching the phase comparator.

5. The dual-mode wireless telephone of claim 1, wherein the signal generator comprises a charge pump and a low-pass filter.

6. The dual-mode wireless telephone of claim 1, wherein the UP signal is set high and the DOWN signal is set low when the frequency of the delta signal lags the frequency of the intermediate signal.

7. The dual-mode wireless telephone of claim 1, wherein the UP signal is set low and the DOWN signal is set high when the frequency of the delta signal leads the frequency of the intermediate signal.

8. The dual-mode wireless telephone of claim 1, wherein the switch is formed on an integrated circuit.

9. The dual-mode wireless telephone of claim 8, wherein the switch comprises a plurality of switching transistors.

10. A method of generating either a high side lock or a low side lock from a phase lock loop (PLL), the method comprising the steps of:
   combining a local oscillator signal with an output signal to create a first combined signal;
   comparing the first combined signal with an intermediate signal;
   generating an UP signal on a first signal line and a DOWN signal on a second signal line based on the comparison of the first combined signal and the intermediate signal;

selecting the high side lock or the low side lock of the phase lock loop;

switching the UP signal to the second signal line so that the PLL locks to operate in a first of two modes and the DOWN signal to the first signal line when the low side lock is selected so that the PLL locks to operate in a second of two modes; and adjusting the output signal.

11. The method of claim 10, wherein the combining step also includes the creation of a second combined signal and further comprises the step of filtering the second combined signal prior to the comparing step.

12. The method of claim 10, wherein a frequency of the local oscillator signal is selected to be between a frequency of the output signal during a high side lock and a frequency of the output signal during a low side lock.

13. The method of claim 10, wherein the output signal is adjusted with a voltage controlled oscillator.

14. The method of claim 10, wherein the first combined signal is compared with the intermediate signal with a phase frequency detector.

15. The method of claim 10, wherein the phase lock loop is used in a wireless telephone.

16. The method of claim 15, wherein the wireless telephone is capable of operating at two different bands of frequencies.

17. The method of claim 10, wherein the UP signal is set high and the DOWN signal is set low when the frequency of the first combined signal lags the frequency of the intermediate signal.

18. The method of claim 10, wherein the UP signal is set low and the DOWN signal is set high when the frequency of the first combined signal leads the frequency of the intermediate signal.

19. A phase lock loop (PLL) capable of selectively generating an output signal within one of two bands of frequencies, the phase lock loop comprising:

a phase detector which generates a first signal and a second signal;

a signal generator having a first input and a second input and generating a control signal based on the signals on the first input and the second input;

an output frequency selector having a first position and a second position, wherein in a first position the output frequency selector transfers the first signal to the first input of the signal generator and transfers the second signal to the second input of the signal generator so that the PLL operates in a first of said two bands of frequencies, and in a second position the output frequency selector transfers the first signal to the second input of the signal generator and transfers the second signal to the first input of the signal generator so that the PLL operate in a second of said two bands of frequencies; and an oscillator which receives the control signal and adjusts the frequency of the output signal based on the control signal.

20. The phase lock loop of claim 19, wherein the phase detector compares an intermediate signal with a delta signal.

21. The phase lock loop of claim 20, wherein the first signal is set high and the second signal is set low when the frequency of the delta signal lags the frequency of the intermediate signal.

22. The phase lock loop of claim 20, wherein the first signal is set low and the second signal is set high when the frequency of the delta signal leads the frequency of the intermediate signal.

23. The phase lock loop of claim 20, wherein the delta signal is created by combining a local oscillator signal and the output signal.

24. The phase lock loop of claim 19, wherein the signal generator comprises a charge pump and a low-pass filter.

25. The phase lock loop of claim 19, wherein the first signal is an UP signal and the second signal is a DOWN signal.

26. The phase lock loop of claim 19, wherein the output frequency selector is a switch.

27. The phase lock loop of claim 26, wherein the switch is formed on an integrated circuit.

28. An output circuit for a dual mode cellular phone comprising:

a local oscillator;

a processor;

a phase lock loop having a switch controlled by the processor between a phase frequency detector and a signal generator, said switch having a first position connecting the up side of the phase frequency detector to a first input of a signal generator and the down side of the phase frequency detector to a second input of the signal generator and a second position connecting the up side of the phase frequency detector to said second input of the signal generator and the down side of the phase frequency detector to said first input of said signal generator;

said phase frequency detector of said phase lock loop having a modulated intermediate frequency input and a feedback loop input;

a mixer having two inputs, one input in communication with the local oscillator and the other input in communication with an output of the phase lock loop to mix the signals from these sources;

a low pass filter between the mixer and the feedback loop input of the phase lock loop to provide a difference signal from the mixer to the feedback loop input of the phase lock loop; and wherein the output of the phase lock loop can generate at least two carrier frequencies spaced by at least 200 MHz without adding a second local oscillator by switching said processor controlled switch between said first and second position.

29. The output circuit of claim 28, wherein the local oscillator generates a signal having a frequency between the at least two carrier frequencies.

30. The output circuit of claim 28, wherein the at least two carrier frequencies are generated by a voltage controlled oscillator.

31. A dual-mode cellular phone comprising:

a processor;

a microphone which converts sound to electrical signals to be processed by the processor;

a speaker which receives signals from the processor to be converted into sound;

a transceiver which communicates with the processor, the transceiver being capable of transmitting and receiving carrier signals on at least two different frequencies using only a single local oscillator, wherein the transceiver has a phase lock loop (PLL) comprising:

a phase detector which generates a first signal and a second signal;

a signal generator having a first input and a second input and generating a control signal based on the signals on the first input and the second input;

a carrier frequency selector having a first position and a second position, wherein in a first position the carrier frequency selector transfers the first signal to the first input of the signal generator and transfers the second signal to the second input of the signal generator so that the PLL operates in a first of two modes, and in a second position the carrier frequency selector transfers the first signal to the second input of the signal generator and transfers the second signal to the first input of the signal generator so that the PLL operates in a second of two modes; and an oscillator which receives the control signal and adjusts the frequency of the carrier signal based on the control signal;

an amplifier which increases the power of the carrier signal from the transceiver to be transmitted; and an antenna which transmits the amplified signal.

32. The dual-mode cellular phone of claim 31, wherein the frequencies of the carrier signals are spaced by at least 200 MHz.

* * * * *